(12) United States Patent
Hegedus

(10) Patent No.: US 7,906,348 B2
(45) Date of Patent: Mar. 15, 2011

(54) METHOD OF FEED FORWARD CONTROL OF SCANNED RAPID THERMAL PROCESSING

(75) Inventor: Andreas G. Hegedus, Burlingame, CA (US)

(73) Assignee: Applied Materials, Inc., Santa Clara, CA (US)

(*) Notice: Subject to any disclaimer, the term of this patent is extended or adjusted under 35 U.S.C. 154(b) by 228 days.

(21) Appl. No.: 11/532,651

(22) Filed: Sep. 18, 2006

(65) Prior Publication Data
US 2007/0020783 A1   Jan. 25, 2007

Related U.S. Application Data

(62) Division of application No. 11/151,879, filed on Jun. 13, 2005, now Pat. No. 7,279,657.

(51) Int. Cl.
*H01L 21/66* (2006.01)
(52) U.S. Cl. .................................................... 438/14
(58) Field of Classification Search ............ 356/72, 356/141, 600, 237.2; 438/7–10, 14–16, 758, 438/72, 200, 253, 127, 106, 680
See application file for complete search history.

(56) References Cited

U.S. PATENT DOCUMENTS

| | | | |
|---|---|---|---|
| 5,254,830 A | 10/1993 | Zarowin et al. | 219/121.43 |
| 5,871,805 A | 2/1999 | Lemelson | 427/8 |
| 5,910,842 A | 6/1999 | Piwonka-Corle et al. | |
| 6,531,481 B2 | 3/2003 | Carroll et al. | 219/121.8 |
| 6,885,444 B2 | 4/2005 | Borden et al. | |
| 6,908,774 B2 | 6/2005 | Ghyselen et al. | 438/14 |
| 7,224,882 B2* | 5/2007 | Bryan et al. | 385/141 |
| 2002/0102749 A1* | 8/2002 | Fielden et al. | 438/14 |
| 2003/0010750 A1 | 1/2003 | Petrucci et al. | |
| 2003/0196996 A1 | 10/2003 | Jennings et al. | 219/121.73 |
| 2004/0092045 A1* | 5/2004 | Bultman et al. | 438/16 |
| 2004/0121605 A1 | 6/2004 | Maydan et al. | 438/694 |
| 2004/0235205 A1* | 11/2004 | Levy et al. | 438/14 |
| 2006/0219678 A1* | 10/2006 | Sopori | 219/121.72 |

* cited by examiner

*Primary Examiner* — Charles D Garber
*Assistant Examiner* — Andre' C Stevenson
(74) *Attorney, Agent, or Firm* — Law Offices of Charles Guenzer

(57) ABSTRACT

A thermal processing system and method including scanning a line beam of intense radiation in a direction transverse to the line direction for thermally processing a wafer with a localized effectively pulsed beam of radiant energy. The thickness of the wafer is two-dimensionally mapped and the map is used to control the degree of thermal processing, for example, the intensity of radiation in the line beam to increase the uniformity. The processing may include selective etching of a pre-existing layer or depositing more material by chemical vapor deposition.

22 Claims, 3 Drawing Sheets

METHOD OF FEED FORWARD CONTROL OF SCANNED RAPID THERMAL PROCESSING

RELATED APPLICATION

This application is a division of Ser. No. 11/151,879, filed Jun. 13, 2005, now issued as U.S. Pat. No. 7,279,657.

FIELD OF THE INVENTION

The invention relates generally to thermal processing of semiconductor substrates. In particular, the invention relates to rapid thermal processing including scanning a beam of radiant energy across the substrate.

BACKGROUND ART

Rapid thermal processing (RTP) is a well developed technology for fabricating semiconductor integrated circuits in which the substrate, for example, a silicon wafer, is irradiated with high-intensity optical radiation to quickly heat the substrate to a relatively high temperature to thermally activate a process in the substrate. Once the substrate has been thermally processed, the radiant energy is removed and the substrate quickly cools. Thereby, the thermal budget is reduced because the RTP chamber itself is not heated to the elevated temperatures required for processing the substrate. RTP has been applied to a number of different applications including annealing, silicidation, oxidation and nitridation, etching, smoothing, and chemical vapor deposition as examples.

Conventionally RTP chambers have relied upon a large number of high-intensity lamps, for example, tungsten halogen lamps arranged in an array over a silicon wafer. The lamps can be quickly turned on and off, thereby achieving high thermal ramp-up and ramp-down rates on the wafer. However, advanced integrated circuits are demanding even quicker heating rates. Several laser-based RTP systems have been proposed in which a laser producing a relatively small beam is scanned over the surface of the wafer. In one type of scanned laser RTP system, 20 ns of pulsed laser radiation is directed to different small areas of the wafer. The high-intensity pulsed radiation very quickly heats the surface of the localized area to a high temperature without significantly heating the supporting substrate.

Another approach generates a narrow line beam of CW laser radiation which is scanned across the wafer in a direction transverse to the line. Thereby, the laser radiation strikes a particular area for only a relatively short time. Scanning of a linear CW beam thus also produces very high thermal heating rates of the surface without significantly heating the supporting substrate. The linear beam also inherently provides better uniformity than the pulsed spot beams characteristic of high-energy pulsed lasers. Jennings et al. describes such a scanned line beam in U.S. Published Application 2003/0196996, incorporated herein by reference in its entirety. Markle et al. disclose another type of such apparatus in U.S. Pat. No. 6,531,681.

Uniformity becomes a continuingly more stringent requirement for advanced integrated circuits. Non-uniformities may arise from present processing conditions or from prior stages of fabrication. Most processing, including RTP, assumes that the wafer being processed is substantially uniform on a macroscopic basis and the control system attempts to make the current process as uniform as possible. In any case, any improvement in uniformity simplifies the design of the integrated circuit and increases the fabrication yield.

Some types of processing afford control over radial profiles. For example, in rapid thermal processing (RTP), an array of high-intensity lamps is directed at a spinning wafer. The wafer rotation substantially guarantees circumferential uniformity of thermal processing. Several pyrometers or other temperature measuring devices are directed at different radii of the wafer and the lamp array is divided into multiple radial heating zones which are separately controlled. In typical operation, the amount of power delivered to the different heating zones is varied to provide a uniform temperature profile. In some situations, the heating control may be used to provide a radially non-uniform temperature profile. For example, in feedback control, one or more test wafers are thermally processed according to a set recipe and then characterized for any radial non-uniformity. The recipe for processing of future wafers is then modified with an adjusted radial heating pattern which reduces the observed radial non-uniformity. Similar feed back radial control has been practiced in chemical mechanical polishing (CMP) in which wafer rotation provides circumferential uniformity and a the radial pressure profile is adjusted to correct non-uniformities observed on test wafers.

Such feed back control suffers several disadvantages. First, it is substantially incapable of correcting a two-dimensional variation in uniformity, particularly when the non-uniformity arises in a previous step in which the wafer is not rotated to provide circumferential uniformity. Secondly, it assumes that any non-uniformities are not varying in time or from wafer to wafer.

Although the invention is not so limited, one technology area suffering from macroscopic non-uniformities involves silicon-on-insulator (SOI) wafers. SOI wafers are already applied to MEMS (micro electromechanical system) chips and are anticipated to be used in very advanced silicon integrated circuits. An SOI wafer 10, illustrated in cross section in FIG. 1, includes a silicon wafer 12 over which is deposited a dielectric layer 14, for example, a silicon dioxide layer 14 deposited by CVD (chemical vapor deposition). A silicon layer 16 is then deposited over the dielectric layer 14 in another CVD process. The silicon layer 16 as deposited is typically polycrystalline. If desired, the polycrystalline silicon may be converted to monocrystalline silicon by techniques well known in SOI technology. The illustrated structure is usually formed in a blanket, unpatterned structure over an entire wafer.

In an alternative SOI technology, usually referred to as the Soitec process, heavy ions are implanted at a predetermined depth into a silicon donor wafer, which is then bonded to a silicon acceptor wafer with an oxide layer therebetween. The underlying donor wafer is then cleaved along the implantation line to leave a thin silicon surface layer overlying the oxide layer.

Standard semiconductor fabrication techniques, including CVD, sputtering, etching, and photolithography, are then used to form semiconductor or MEMS devices in and over the silicon layer 16. After the device definition, the SOI wafer 10 is diced into a number of integrated circuit chips. The SOI structure is particularly advantageous for semiconductor devices because the dielectric layer 14 insulates the devices from the silicon substrate 12 and thereby virtually eliminates leakage and parasitic capacitance between the devices and the substrate. However, device performance is enhanced if the silicon layer 16 is uniformly thick. Unfortunately, it often occurs that the as deposited silicon layer 16 has significant variations in thickness over lateral distances of many millimeters with an irregular pattern of peaks 17 and valleys 18 and these variations may vary in a two-dimensional pattern with no easily defined symmetry. Even a four-fold asymmetry is difficult to compensate. Although better process control may improve the thickness uniformity, it is desired to improve the thickness uniformity on already fabricated SOI wafers.

Accordingly, it is desired to provide a control system that affords greater and closer control especially in a thermal processing system.

SUMMARY OF THE INVENTION

An apparatus for thermally processing a substrate, for example, by etching, includes scanning an elongated beam across the wafer. The amount of radiation delivered to the wafer is determined by a measurement of a layer thickness prior to the processing. The processing may include an etching process which selectively etches the measured layer to produce a more uniform thickness. The processing may include chemical vapor deposition of an additional layer of the same or different composition as the measured layer.

The thickness measurement may be performed on a separate thickness measuring apparatus, such as a scanning ellipsometer, or the thickness measuring apparatus may be included on the thermal processing equipment.

The invention also includes various methods practiced on such apparatus. The methods include a thickness measurement on a separate apparatus for a feed forward control of the thermal process, an in-situ measurement of the thickness in the thermal processing chamber for either a separate thickness mapping, a real-time determination of the thickness prior to processing, or a post-processing determination of thickness for subsequent processing.

A broad aspect of the invention includes a two-dimensional scan of a thermal treatment beam over a substrate with the total radiant energy delivered to a position on the wafer being determined by a two-dimensional control table. Most directly, the intensity of a line beam is varied according to a two-dimensional processing map.

DETAILED DESCRIPTION OF THE PREFERRED EMBODIMENT

The invention provides feed forward control of thermal processing, particularly accounting for two-dimensional variation, in a thermal processing apparatus delivering a localized heat source to thermally activate the process. The invention relies upon controllably varying the radiant energy delivered to different portions of the substrate being subjected to a thermally activated process to control the degree of thermal processing. For example, if the incoming substrate has a spatially varying non-uniformity, the thermal process is spatially varied in a reciprocal manner to compensate for the non-uniformity.

Figure 1:
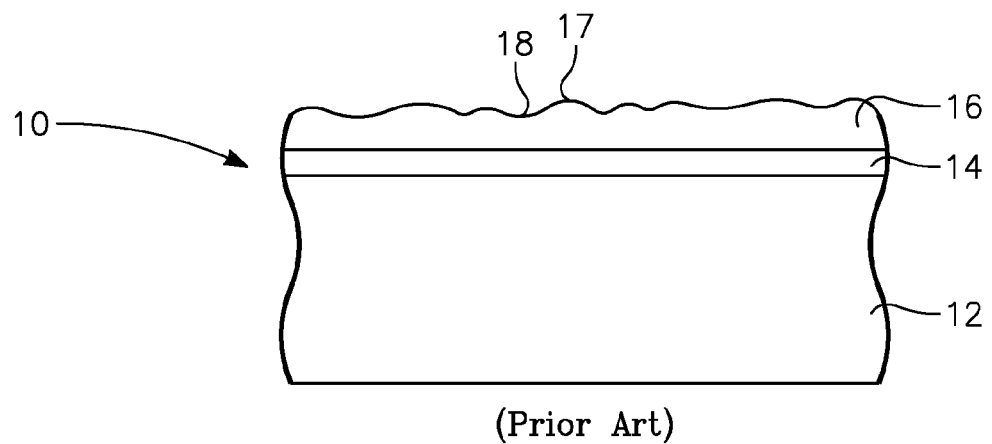
FIG. 1 is a cross-sectional view of a silicon-on-insulator wafer.

The invention may be practiced with different processes and substrate structures. Although the invention is not so limited, one beneficial application of the invention allows more uniform silicon layers to be formed in the previously described SOI (silicon on insulator) wafer. According to an exemplary method of practicing the invention, after the SOI wafer 10 of FIG. 1 has been formed, complete with its non-uniform silicon layer 16, the SOI wafer 10 is delivered to a feed forward measurement and etching system 20, illustrated in the schematic diagram of FIG. 2. The system 20 obtains a two-dimensional map of the thickness distribution of the silicon layer 10 over the entire surface of the wafer and uses the map to selectively etch different areas of the wafer to produce a more uniform thickness of the silicon layer 16. The wafer 10 with the silicon layer 16 is placed in a measuring apparatus capable of measuring a thickness map across the two-dimensional extent of the wafer 10. Such a measuring apparatus is a scanning ellipsometer 22, such as the Asset F5 available from KLA-Tencor. The wafer 10 is fixed in the ellipsometer 22 with a wafer alignment indicia 24, such as a notch, flat, or internal alignment marks aligned to known coordinates of the ellipsometer 22.

The ellipsometer 22 maps the thickness of the silicon layer 16 by well known techniques and stores the resultant map in a memory 26. The map includes both the thickness values as well as the two-dimensional positions on the wafer 10 for these thicknesses. Of course, the positions can be based on array indices in a well defined array of thickness values. The memory 26 may be a recordable medium, such as a removable disk, or it may be a hard disk or electronic memory incorporated into a computer.

The thickness map stored in the memory 26 is used to control the selective thinning of the silicon layer 16 of the wafer 10 in a scanning thermal treatment apparatus 30. Although illustrated as an integrated system The wafer 10 is transferred from the scanning ellipsometer 22 to an x-y, two-dimensional translation stage 32 of the thermal treatment apparatus 30 adapted for etching. It is advantageous for the stage 32 to additionally include a z-movement and also pitch and roll to control the focusing of the radiation beam. In brief, the thermal treatment apparatus 30 includes a laser source 34 of a heating beam 36 of electromagnetic radiation, such as a GaAs laser bar. Optics 38 shape and focus the laser beam into an elongated line beam 40 on the wafer surface, having a ratio of length to width of at least 5 and preferably at least 10, and in some applications much higher. It is understood that the axis of the heating beam 36 may be substantially inclined from the normal of the wafer 10 as it strikes the wafer 10, which advantageously increases optical coupling and reduces deleterious feedback to the laser source 34. The line beam 40 has a long dimension, for example, a millimeter or longer, and a short dimension, which may be less than 500 μm.

The wafer 10 is placed onto the stage 32 at a well defined position with its alignment indicia 24 pointing in a precise angle. Thereby, the location on the stage 32 or the translation of the stage 32 can be correlated with the two-dimensional locations of the thickness map stored in the memory 26. During thermal processing, a controller 42 controls an amount of power which a variable power supply 44 delivers to the laser source 34, hence controlling the intensity of the line beam 40, in accordance with the thickness map in the memory 26, in order to etch sufficient material in any location to reduce the thickness variation. Concurrently, the controller 42 controls the stage 32 to move the wafer 10 along the direction of the short dimension of the line beam 40. Alternatively, the wafer 10 may be placed on a stationary chuck and a translation mechanism associated with the optics 38 and laser source 34 moves the line beam 40 along its short dimension relative to the stationary wafer 10. The axis of this scan is often referred to as the fast axis. The narrow dimension of the line beam is small enough and the scan speed high enough that any position on the track being irradiated is exposed to a very short pulse of intense laser radiation. The pulse is so short that the heating extends a relatively small distance into the wafer 10. Thereby, the depth of thermal treatment can be controlled and reduced and the total thermal budget is reduced even if the same maximum surface temperature is achieved.

In the typical situation in which the long dimension of the line beam 40 is shorter than the diameter of the wafer 10 (currently planned line lengths are about 1 mm), after the line beam 40 has been scanned in one track across the wafer 10 in the fast axis, the stage 32 moves the wafer in the perpendicular direction, often referred to as the slow axis, to an adjacent track. Another fast axis scan is performed on the new track. The alternating translations along the fast and slow axes are repeated until thermal treatment of the useful area of the wafer 10 is completed.

Figure 3:
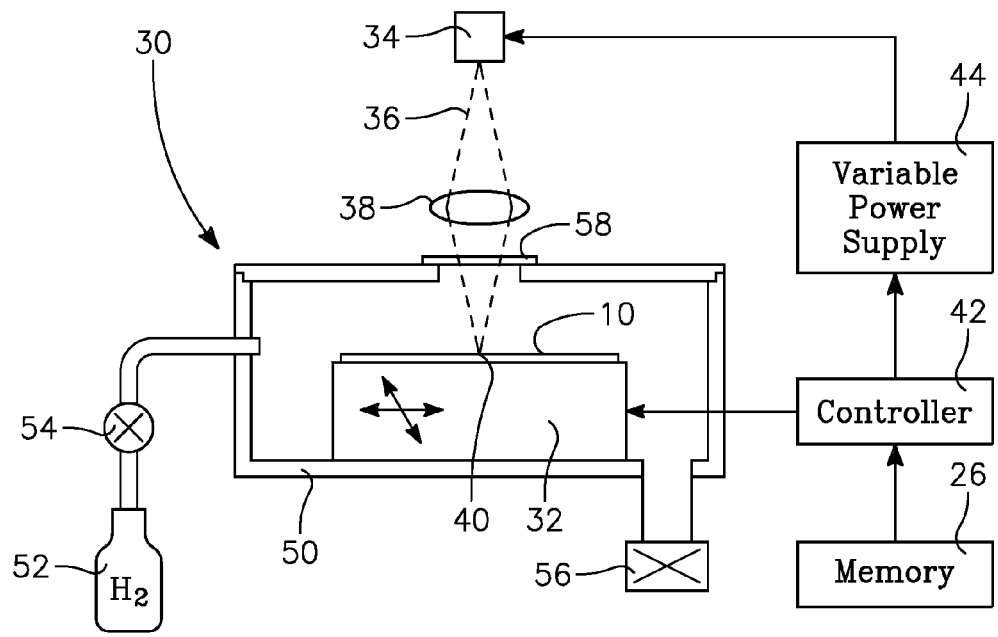
FIG. 3 is a schematic cross-sectional view of one embodiment of the thermal processing sub-system of FIG. 2.

The thermal treatment apparatus 30 is further illustrated in the schematic cross-sectional view of FIG. 3 and includes a vacuum chamber 50 in which the stage 32 supports the wafer 10. A gas source 52 supplies a processing gas, for example, an etch gas such as $H_2$, into the chamber 50 through a mass flow controller 54. A vacuum pump 56 maintains the vacuum chamber 50 at the requisite pressure and exhausts reacted processing gas and reaction by products. A window 58 which is essentially transparent to the laser radiation is sealed to the vacuum chamber 50 over the stage 32 so that the laser beam 36 is produced and focused by elements exterior to the vacuum chamber 50 into the line beam 40 on the surface of the wafer 10 as it is being scanned within the vacuum chamber 50.

The thermal treatment apparatus 30 is capable of etching the silicon material by the etching gas in a thermally activated process relying upon the intense line beam 40. The etching gas flows across the face of the wafer 10 but, outside of the area of the line beam 40, the wafer temperature is too low to activate the etch reactions, for example, $H_2$ converting Si into volatile $SiH_4$. That is, away from the line beam 40, the etch gas does not react with silicon and does not etch the wafer 10. However, the thermal heat pulse produced by the scanned line beam 40 raises a small area of the wafer 10 to above the thermal activation threshold and that small area of the wafer 10 is etched. The etch gas is not limited to $H_2$ and other gases such as $Cl_2$, HCl, $C_2F_6$, and other gases known to etch silicon may used be individually or in combination to selectively thin the silicon layer.

The apparatus may be applied in a feed forward fashion to selectively etch the silicon layer to produce a more uniform layer. Because the wafer 10 was properly aligned on both the scanning ellipsometer 22 and on the stage 32 of the thermal treatment apparatus, the controller 42 can utilize the thickness map stored in the memory 26 to determine how much etching is required for the area of the wafer 10 currently irradiated by the line beam 40 to reduce its thickness to the desired uniform value. The controller 42 can increase the etch rate for overly thick areas by increasing the power delivered to the laser source 34 by the variable power supply 44. It is also possible to operate with constant power delivered to the laser source 34 but to selectively attenuate or deflect the laser beam. Alternatively, the controller 42 can instruct the stage 32 to reduce the scan speed along the fast axis. For areas of the wafer 10 which the thickness map indicates are not so thick, the controller 42 can reduce the laser power or increase the scan speed. In yet another embodiment, the controller 66 may control the etch mass flow controller 54 to either turn on and off the etching gas or to vary its supply quantity or to control the pump system 56 to control the presence of etch gas in the chamber, both of which affect the etching rate.

It is appreciated that the process needs to be normalized by determining which area of the wafer has the thickest silicon layer, which thickness dictates the maximum etching rate. Furthermore, the process needs to be based on a desired uniform final thickness, which can be no thicker than the minimum thickness stored in the thickness map.

Although the feed forward measurement and etching system 20 are illustrated as an integrated system, the measurement system 22 and the etching system 30 may be at different locations. It is understood that the memory 26 represents a body of data and is not tied to a particular storage medium or media. A recorded disk can be transferred from the ellipsometer 22 to the controller 42 of the thermal treatment apparatus 30. The data may be transferred over a communications network or other electrical connection. It is not necessary that a wafer whose thickness is measured by the measurement system 22 be immediately etched in the scanning thermal treatment apparatus 30. For example, a large number of wafers may have their thickness profiles measured and these data are stored together with an identification of the wafer. Thereafter, the batch of wafers are sequentially and selectively etched in the scanning thermal treatment apparatus 30 according to the thickness map identified to the current wafer being etched.

Figure 4:
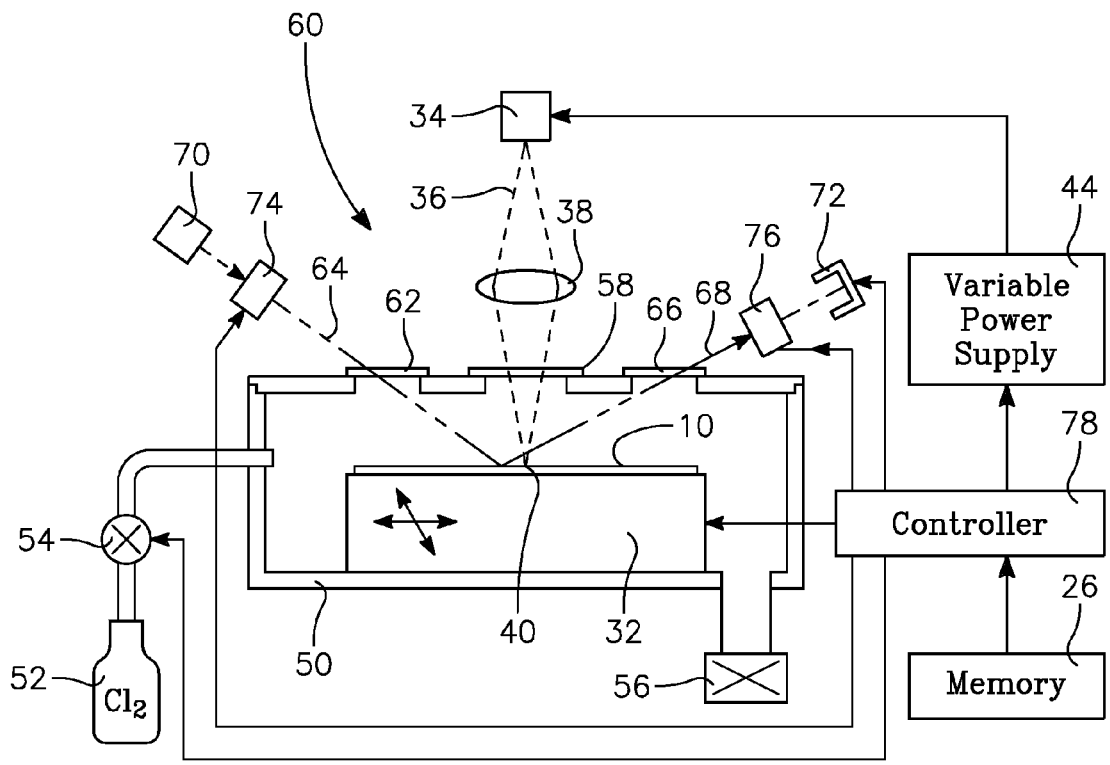
FIG. 4 is a schematic cross-sectional view of an integrated system for mapping a thickness distribution and for thermally processing it.

It is possible to combine the ellipsometer and thermal treatment apparatus in an in-situ or even real-time measurement and selective thinning apparatus 60 illustrated schematically in FIG. 4. An ellipsometer is formed in and around the vacuum chamber 50 having one additional window 62 for a probe beam 64 striking the wafer 10, typically preferably offset from the line beam 40, and yet a further additional window 66 for a reflected beam 68. An optical source 70 produces the probe beam 64 and a detector 72 detects the intensity of the reflected beam 68. Ellipsometer input optics 74 and output optics 76 include the conventional synchronously rotating polarizers and associated electronics and optics required for an ellipsometer. A controller 78 not only controls the variable power supply 44 and the translation stage 32 but also controls the ellipsometer optics 74, 76 and receives the output of the optical detector 72.

The combined apparatus 60 can operate in several modes. In one mode, the ellipsometry equipment included in the combined system 60 can replace the separate scanning ellipsometer 22 of FIG. 2. First, the ellipsometry equipment of the combined system 60 is used in combination with the translation stage 32 to measure the two-dimensional distribution of thickness of the wafer 10 and to store thickness map in the memory 26. Then, the same wafer 10, without being moved from the stage 32, is subjected to selective thinning in accordance with the measured thickness map and with the supply of the etching gas. This mode may be considered as in-situ ellipsometry.

In another mode, the included ellipsometry equipment may be focused on an area of the wafer 10 about to enter the thermal treatment line beam 40 while the etching gas is etching the wafer area under the line beam 40. The ellipsometer determines the thickness of that area and, with a proper time delay, the controller 78 adjusts the power level of the thermal laser source 34 or the fast-axis scanning speed of the translation stage 32. This mode may be considered as real-time ellipsometry.

In a third mode, the ellipsometry equipment measures the thickness of the wafer 10 after it has been etched, either in real time while the etching continues or after the etching has stopped, and allows the controller 78 to determine if further etching is required. This mode may be considered as in-situ feedback ellipsometry.

Figure 2:
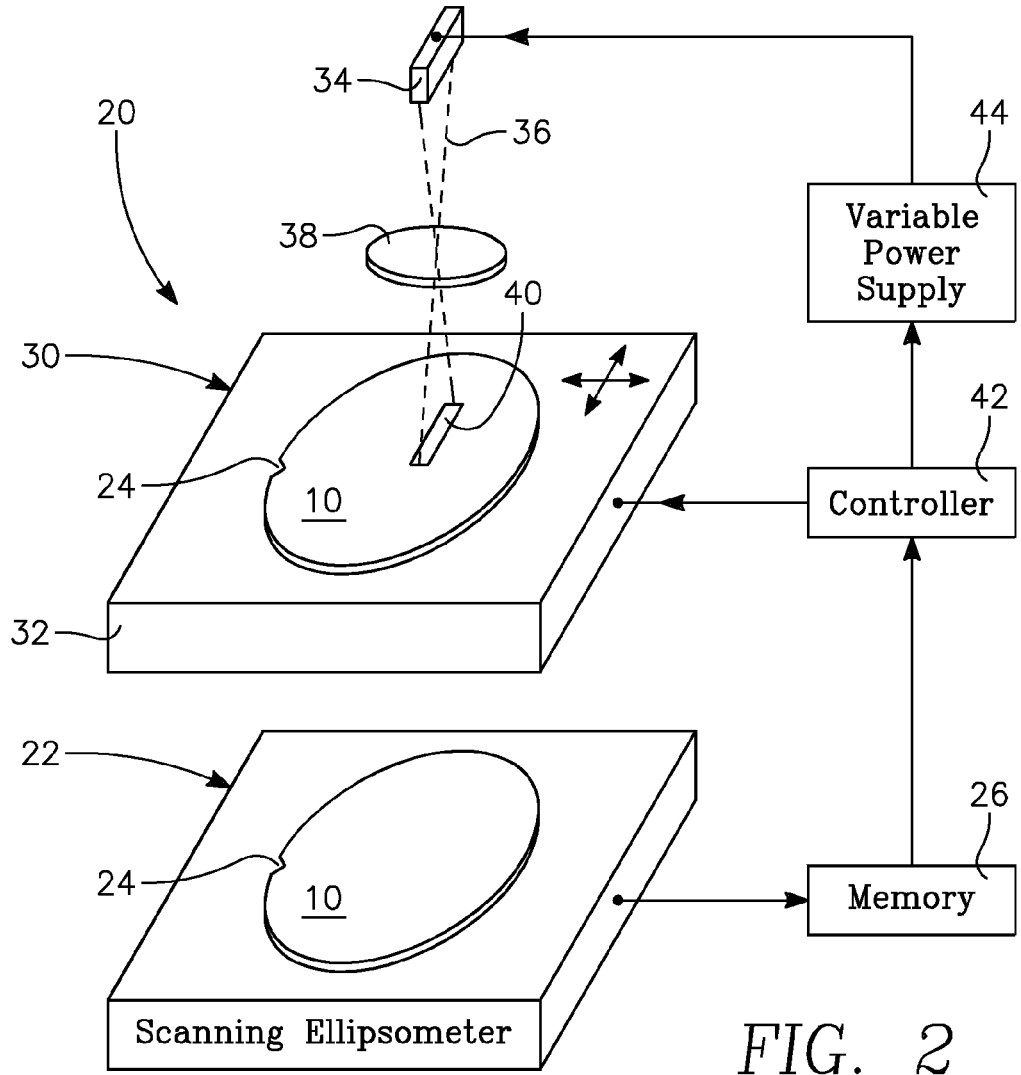
FIG. 2 is a schematic orthographic view of a system including two sub-systems for mapping a thickness distribution on a wafer and thermally processing that wafer according to the mapped thickness.

It is possible to combine the separate scanning ellipsometer 22 of FIG. 2 with the integrated ellipsometer of FIG. 4 to increase throughput and also improve the uniformity.

The ellipsometry may use one or more wavelengths. Alternative to ellipsometry, other types of thickness measuring equipment may be used, such as a map of surface resistivity for a conductive layer. Reflectometry may be used, but is generally less effective for film thickness below 30 nm.

Although the invention has been described in the embodiment of etching a silicon layer in an SOI wafer, it is not so limited. It may be advantageously used for etching silicon or other blanket layers in other types of wafers in which the thickness of the upper layer may easily be determined, for example, a silica layer overlying a nitride or silicon layer. In general, the invention can be applied to any two-dimensionally scanned thermal treatment apparatus.

Figure 5:
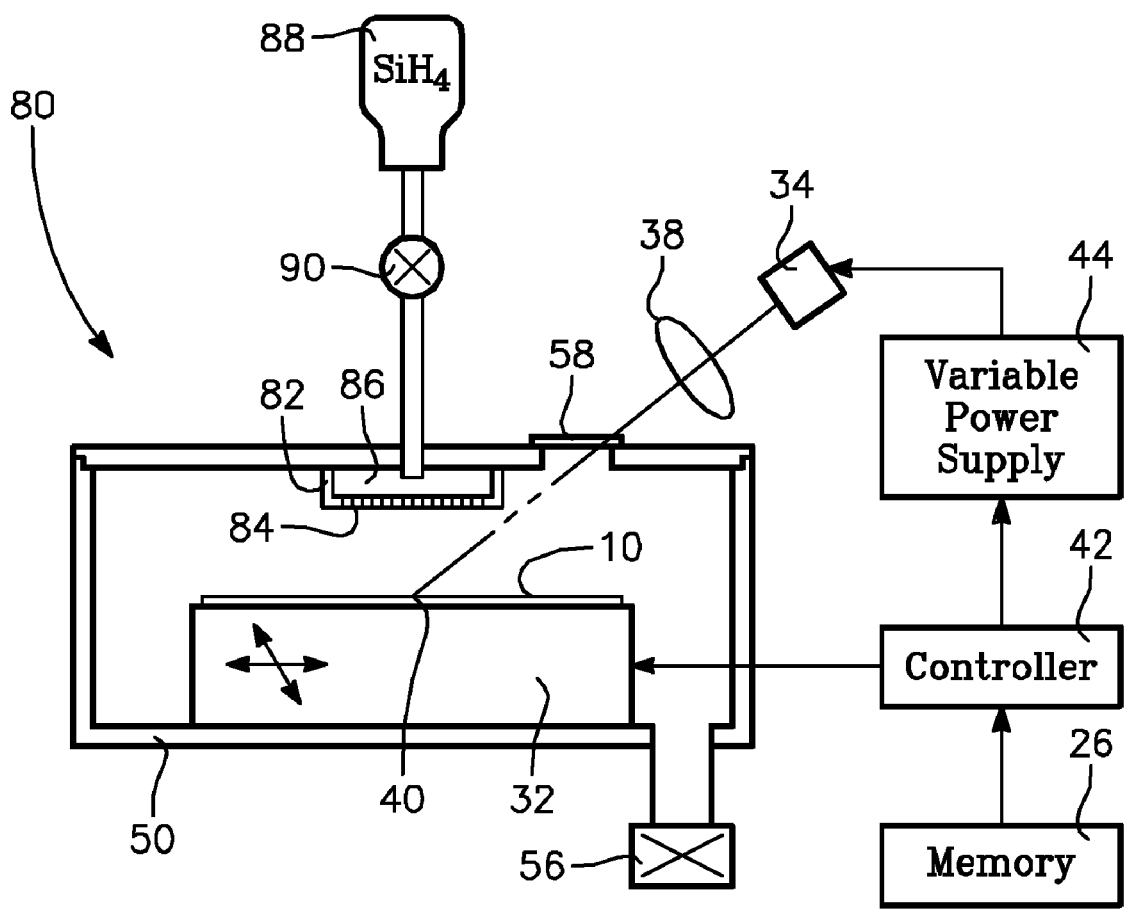
FIG. 5 is a schematic cross-sectional view of an embodiment of the invention including chemical vapor deposition.

Further, the invention may be applied to other types of semiconductor processing, an example being chemical vapor deposition (CVD). As schematically illustrated in FIG. 5, a feed forward thermal scanning CVD system 80 includes a relatively small gas showerhead 82 in opposition to the portion of the wafer 10 including the line beam 40. A number of apertures 84 through the front face of the showerhead 82 communicate the interior of the vacuum chamber 50 to a gas manifold 86. A gas source 88 supplies a CVD precursor gas through a mass flow controller 90 to the gas manifold 86, from which it is uniformly distributed to the area of the wafer 10 around the line beam 40 before being exhausted by the vacuum pumping system 56. An example of a CVD precursor gas is silane ($SiH_4$) used alone or in combination with other gases for the chemical vapor deposition of silicon, silicon dioxide, and silicon nitride. Yet other CVD precursors gases are included within the invention.

In the feed forward control mode with a separate thickness measuring apparatus, the thickness map of the wafer 10 presently aligned on the translation stage 32 is stored in the memory 26. The controller 42 uses the thickness map to control the power supply 44 for the laser source 34 to CVD deposit a selected thickness of the material upon the current position of the wafer 10. Alternatively, the fast-axis scan rate of the stage 32, the amount of precursor gas metered by the mass flow controller 90, or the chamber pressure largely controlled by the vacuum pump system 56 may be selectively controlled on different portions of the wafer 10.

It is possible as well to include the integrated ellipsometer or other thickness measuring device within the CVD system 80 to effect the various modes of operation previously described.

Although the invention has been described in terms of controlling the process according to the thickness of an existing layer, the invention is not so limited. Such lateral variation may be used to account for other variations, for example, process or chamber induced variation.

It is thus seen that the invention provides an unprecedented degree of 2-dimensional control over thickness or other uniformity, whether achieved by etching, deposition or other thermally driven process, not previously achieved. The feed forward control may be implemented with little change of existing equipment and control system. Further, the necessary instrumentation may be integrated with existing equipment without great modification to greatly improve the capabilities of conventional etching and deposition equipment.

The invention claimed is:

1. A process for controlling the thickness of a pre-existing layer on a substrate, comprising the steps of:
   measuring a distribution across an area of said substrate of the thickness of the pre-existing layer on said substrate;
   then irradiating said substrate with a beam of electromagnetic radiation while scanning said beam across said substrate to process the pre-existing layer; and
   during the irradiating step, varying an amount of the electromagnetic radiation delivered to said substrate according to said measured distribution of thickness, to thereby differentially along a path of the scanning beam, across the substrate, to control a thickness of the pre-existing layer.

2. The process of claim 1, wherein said distribution is a two-dimensional distribution, and wherein said beam is an elongated beam which has a short dimension and is scanned across said substrate along the short dimension.

3. The process of claim 1, further including delivering an etching gas into a chamber including said substrate during the irradiating step to thereby differentially etch said pre-existing layer along a length of a scanning of the beam across the substrate, and wherein said varying acts to increase a uniformity of said pre-existing layer along the length.

4. The process of claim 1, wherein said varying includes varying an amount of power supplied to a light source irradiating said substrate.

5. The process of claim 1, wherein said varying includes varying a speed of said scanning.

6. A process for controlling the thickness of a layer on a substrate, comprising the steps of:
   measuring a distribution across an area of said substrate of a thickness of a pre-existing layer on said substrate;
   then irradiating said substrate with a beam of electromagnetic radiation while scanning said beam across said substrate;
   during the irradiating step, varying an amount of the electromagnetic radiation delivered to said substrate according to said measured distribution of thickness; and
   delivering a precursor gas for chemical vapor deposition during the irradiating step to thereby deposit a CVD layer up on said substrate and wherein said varying acts to vary along a length of a scanning of the beam across the substrate a thickness of said CVD layer deposited on the substrate.

7. The process of claim 1, wherein during said scanning said measuring is performed on areas of the substrate of the substrate not yet irradiated by said beam.

8. The process of claim 1, wherein said measuring is completely performed prior to said scanning.

9. The process of claim 1, wherein said measuring includes ellipsometry.

10. A method of feed forward control of a thickness of a pre-existing layer on a substrate, comprising the steps of:
    a first step of scanning an optical probe beam over a two-dimensional path on a surface of a substrate and measuring a distribution over the surface of radiation reflected by the substrate and thereby determining a distribution of thickness of the layer;
    a second step of scanning a heating beam of electromagnetic radiation over a two-dimensional path on the surface of the substrate to process and change a thickness of the layer; and during the second step, varying an amount of energy delivered by the heating beam in accordance with the measured distribution of the radiation to thereby differentially control the thickness of the layer over the two-dimensional path.

11. The method of claim 10, wherein the varying includes varying an intensity of the heating beam.

12. The method of claim 10, wherein the varying includes varying a speed of scanning of the heating beam over the surface.

13. The method of claim 10, wherein the scanning the optical probe beam and the measuring include ellipsometry.

14. The method of claim 10, wherein the first and second steps are performed concurrently on the substrate.

15. The method of claim 10, wherein the first step is completed before the initiation of the second step.

16. The method of claim 10, wherein the second step includes exposing the substrate to an etching gas.

17. The method of claim 10, wherein the second step includes exposing the substrate to a precursor gas for chemical vapor deposition upon the substrate.

18. The method of claim 10, wherein the heating beam has an elongated shape with a long dimension and the second step scans the heating beam in a direction perpendicular to the long dimension.

19. The method of claim 1, wherein the varying step varies an amount of the electromagnetic radiation delivered to different portions of a surface of the substrate to affect a differential degree of processing in the different portions.

20. The method of claim 10, wherein the varying step causes different amounts of the energy to be delivered by the beam to different surface portions of the substrate in response to the measured radiation.

21. The method of claim 1, wherein the varying step differentially controls the thickness of the pre-existing layer to make the pre-existing layer have a more uniform thickness along the path.

22. The method of claim 10, wherein the varying step differentially controls the thickness of the layer to cause the layer to have a more uniform thickness along the two-dimensional path.

* * * * *